United States Patent [19]

Kotera et al.

[11] 4,128,681
[45] Dec. 5, 1978

[54] METHOD FOR PRODUCING AN InSb THIN FILM ELEMENT

[75] Inventors: Nobuo Kotera, Kokubunji; Nobuo Miyamoto, Hachioji, both of Japan

[73] Assignee: Hitachi, Ltd., Japan

[21] Appl. No.: 735,139

[22] Filed: Oct. 26, 1976

[30] Foreign Application Priority Data

Oct. 24, 1975 [JP] Japan .................................. 50-127403

[51] Int. Cl.² .............................................. B32B 15/20
[52] U.S. Cl. ......................................... 428/138; 428/213; 428/336; 428/469; 428/215; 427/87; 427/376 R; 427/376 E; 427/89
[58] Field of Search ............... 156/610, 613–614; 427/87, 376 R, 376 E, 89; 428/469, 215, 213, 336

[56] References Cited

U.S. PATENT DOCUMENTS

| | | | |
|---|---|---|---|
| 3,082,124 | 3/1963 | French et al. | 427/56 |
| 3,287,243 | 11/1966 | Ligenza | 428/469 X |
| 3,674,549 | 7/1972 | Ohshita et al. | 427/86 |
| 3,984,263 | 10/1976 | Asao et al. | 156/610 X |

OTHER PUBLICATIONS

Billings; J. Vac. Science Tech., vol. 6 (1969), p. 757.

*Primary Examiner*—George F. Lesmes
*Assistant Examiner*—Alexander S. Thomas
*Attorney, Agent, or Firm*—Craig & Antonelli

[57] ABSTRACT

A method for producing an InSb thin film element comprising the steps of (i) preparing a substrate at least one surface of which is made of alumina or an inorganic insulating material containing at least 12 mol % of alumina, and forming an InSb thin film of a thickness of at most 0.2 μm on the surface of said substrate, (ii) depositing on said InSb thin film a film which is made of an inorganic insulating material containing at least 12 mol % of alumina, (iii) heating said InSb thin film above the melting point of InSb, and (iv) cooling said InSb thin film and recrystallizing InSb. The InSb thin film element thus produced has the InSb thin film whose thickness is at most 0.2 μm, whose surface is flat and which has good electrical characteristics.

36 Claims, 5 Drawing Figures

FIG. 2

| THICKNESS OF InSb Film | UNDER LAYER \ OVER LAYER | SiO₂ | 7059 GLASS | DOUBLE LAYER OF 7059 GLASS AND SiO₂ | (SiO₂)0.5 (Al₂O₃)0.5 | ALUMINA |
|---|---|---|---|---|---|---|
| 0.2 μm | SiO₂ | | | | | |
| | 7059 GLASS | | | | | |
| | ALUMINA | | | | | |
| 0.4 μm | 7059 GLASS | | | | | |

METHOD FOR PRODUCING AN InSb THIN FILM ELEMENT

BACKGROUND OF THE INVENTION (i) Field of the Invention

This invention relates to a method for producing an InSb thin film element whose characteristics are improved by heating above the melting point of InSb. More particularly, it relates to a method for producing an InSb thin film element in which an InSb thin film has a thickness of at most 0.2 $\mu$m and exhibits good electrical characteristics.

(ii) Brief Description of the Prior Art

In resent years, as the computing speed of an electronic computer has become higher, it has been required to render higher the operating sped of transistors for use in the electronic computer. Therefore, also a MOS-IC for the electronic computer need have the operating speed made higher. Since, in general, the operating speed of a transistor is substantially proportional to the electron mobility of a constituent semiconductor material thereof, a MOS type FET constituted of a semiconductive material of high electron mobility comes to be desired. The electron mobility of silicon (Si) having heretofore been employed for transistors is several hundreds $cm^2$/V.sec. It must be said that, insofar as Si is used, it is subject to the limitation to render the operation of a transistor highly speedy. On the other hand, our experiments have revealed that an InSb film having a thickness of, for example, about 1.5 $\mu$m exhibits as high an electron mobility as $6 \times 10^4$ $cm^2$/V.sec. A MOS type FET employing the InSb film is expected to realize a speed exceeding the limitation of the operating speed of the conventional Si-MOS type transistors.

With the MOS type FET employing the InSb film, however, when the thickness of the InSb film is greater than about 0.2 $\mu$m, an electric field normal to the film surface is not effectively applied by the provision of a gate electrode, and the operation as an FET is difficult. Therefore, an InSb thin film whose thickness is about 0.2 $\mu$m or below and which has good electrical characteristics, especially an excellent electron mobility, has come to be desired. However, it has hitherto been extremely difficult to acquire such InSb thin film.

It has heretofore been well known that an InSb film whose thickness is in the order of 1 $\mu$m is deposited on a substrate and thereafter once molten to execute (1) the larger regrowth of crystallite and (2) the purification, whereby the electron mobility of the InSb film can be enhanced. It has also been known that, if there is not any covering film on the InSb film in that case, at above the melting point (525° C.) of the InSb crystal (1) the melt of InSb will agglomerate to rupture the film and (2) Sb of the components of InSb as has a higher vapor pressure is selectively vaporized to deviate from stoichiometry. As the covering film for eliminating the drawbacks, an oxide film containing $In_2O_3$ has been employed (A. R. Billings; J. Vac. Sci. Tech., vol. 6 (1969), page 757). Since, however, the oxide film is soft, corrugations arise in the InSb film when InSb recrystallizes from the melt. Unless the corrugations attributed to the crystal growth of InSb are suppressed, the thickness of the InSb film on the substrate does not become uniform. When, to the end of preventing this inconvenience, a hard vitreous covering film is deposited on the InSb film and the InSb film is molten, the glass film cracks. When the thin film whose thickness is at most 0.2 $\mu$m is formed with the corrugations as stated above and its surfaces becomes uneven, the production of the element becomes difficult. However, unless the recrystallization being the cause for the development of the corrugations is carried out, the electron mobility of the InSb film is very low and such InSb film can not be put into practical use.

SUMMARY OF THE INVENTION

An object of this invention is to provide a method for readily producing an InSb thin film element whose proper or main body is an InSb thin film being at most 0.2 $\mu$m in thickness, having an even surface and exhibiting good electrical properties.

In order to accomplish the object, a method for producing an InSb thin film element according to this invention comprises the steps of (i) preparing a substrate at least one surface of which is made of alumina (hereinafter, the expression "alumina" shall cover all aluminium oxides) or an inorganic insulating material containing at least 12 mol % of alumina, and forming an InSb thin film of a thickness of at most 0.2 $\mu$m on the surface of said substrate, (ii) depositing on said InSb thin film a film (an overlying layer) which is made of alumina or an inorganic insulating material containing at least 12 mol % of alumina, (iii) heating said InSb thin film above the melting point of InSb, and (iv) cooling and InSb thin film and recrystallizing InSb.

The inventors of this invention have found out that, when the thickness of an InSb film is at most 0.2 $\mu$m, the InSb film which prevents the cracking of the covering film for the InSb film and also prevents the agglomeration of the InSb film, whose surface is flat and which is of high electronic quality becomes obtainable by providing an underlying layer and an overlying layer under and over the InSb film, the layers being made of alumina or an inorganic insulating material which contains at least 12 mol % of alumina, thereafter heating the InSb film above the melting point of the InSb crystal and subsequently cooling and recrystallizing it. This invention has been made on the basis of the abovementioned novel fact.

Where, in the steps (i) and (ii), the amount of alumina contained in the inorganic insulating material is short of 12 mol %, unfavorably the InSb film shows a tendency to agglomerate at the melting thereof. Practical as the inorganic insulating material containing at least 12 mol % of alumina in the steps (i) and (ii) is, for example, No. 7059 Glass produced by Dow Corning Inc. (having a chemical composition consisting of 50 mol % of $SiO_2$, 12 mol % of $Al_2O_3$, 25 mol % of BaO, 13 mol % of $B_2O_3$, 0.05 mol % of MgO, and less than 0.01 mol % of $Na_2O$, and hereinbelow it shall be written "7059 Glass"). In general, however, as long as at least 12 mol % of alumina is contained, a vitreous material made of an oxide and mica are usable for the purpose.

The substrate may be wholly made of alumina or the inorganic insulating material containing at least 12 mol % of alumina. Even when the substrate proper is a different material, it suffices that at least one surface thereof is an insulating layer made of alumina or the alumina containing material. In the former case, sapphire is also usable as the substrate material. In the latter case, the insulating layer is deposited by a well-known process for forming a film, for example, evaporation, sputtering or CVD (chemical vapor deposition), and its appropriate thickness is 0.05 $\mu$m – 10 $\mu$m. If the thickness is below 0.05 $\mu$m, the deposited film will tend to become porous, and if it is above 10 μm, the formation of the film will require a long time and moreover the film will sometimes undergo cracks during or after the formation. The substrate proper in this case may well be a silicon single crystal.

While, for the formation of the InSb thin film, any well-known method may be adopted, the evaporation process is generally employed. The thickness of the thin film shall be 0.2 μm or below. When the thickness is above 0.2 μm, unfavorably the operation in the case of using the thin film for a FET is difficult as stated previously. When the thickness is below 100 Å, the deposited layer shows a tendency to become the form of islands, and hence, the thickness should favorably be at least 100 Å (0.01 μm). A more preferable range of thickness of the InSb thin film is from 400 Å (0.04 μm) to 1,000 Å (0.1 μm). Within this range, even in case where the thin film is used for the FET, an electric field normal to the film surface is sufficiently effectively established by a voltage applied to a gate electrode, and further, the electron mobility can be kept high.

As regards the thickness of the layer of alumina or the inorganic insulating material containing at least 12 mol % of alumina as deposited on the InSb thin film in the step ii), values of 0.05 μm – 1 μm are generally suitable. When the thickness is below 0.05 μm, the layer is prone to become porous. When it exceeds 1 μm, the effect of preventing the occurrence of corrugations at the recrystallizing treatment shows a saturation tendency, and no new improvement is especially noted. In order to cause a sufficient electric field normal to the film surface to act by a suitable gate voltage in case of using the thin film for the FET, it is more favorable that the insulating layer on the InSb thin film is not very thick. By way of example, where the field strength acting on the FET is set at $10^5$ V/cm and the gate voltage at 5 V, the thickness of the insulating layer is about 5,000 Å (0.5 μm). From such viewpoint, the thickness of the insulating layer on the InSb layer should suitably be at most 1 μm. Where the FET's are formed as an IC, the thickness of the insulating layer should preferably be at most 0.6 μm.

The method for forming the insulating layer of alumina or the material containing alumina and the selection of the material are as have been stated previously. However, in case of employing, for example, glass as the inorganic insulating material, it is required to avoid heating the InSb thin film to above the fusion point thereof in the process of forming a glass film. Since, in the melt process for the InSb film in the step (iii), the film is exposed to a temperature of or above 525° C., the insulating layer, for example, the layer of 7059 Glass is sometimes softened. In order to eliminate this difficulty, as an overlying glass film, a hard glass film such as $SiO_2$ can optionally be placed on the insulating film, such as the 7059 Glass film.

The heating temperature in the step (iii) is at least the melting point of InSb (about 525° C.). From the standpoint of cost, it is desirable that it does not exceed about 1,000° C.

The heating atmosphere is usually made an inert gas such as He, and a mixed gas of (Ar + $H_2$) may well be used.

Regarding the heating method, the zone-melting process is expected to bring forth the best result. There may be adopted the normal freezing process in which, after heating and melting within an oven having a temperature gradient, cooling and freezing is carried out. Alternatively, the performance of this invention is possible by the homogeneous melting method in which the whole substrate is uniformly heated. In cases of the homogeneous melting process and the normal freezing process, the heating time at the specified heating temperature is at least the period of time required for the InSb film to melt perfectly. Usually, the period of time required for the melting is about 30 seconds or more. Even when the heating is continued after the perfect melting, no advantageous effect is especially brought forth. Ordinarily, therefore, the heating time is made within 1 minute. However, no particular restriction is needed. In case of the zone-melting process, a good result is obtained by making the moving speed of the molten zone 0.1 μm/sec – 10 μm/sec. However, this is not restrictive.

Regarding the temperature to which the substrates should be cooled down in the step (iv), the room temperature may be adopted insofar as there is no particular reason. If the cooling rate exceeds 30,000° C./hour, an insulating material which constitutes the substrate will be cracked in some cases. Therefore, it should better be made at most the specified value.

Usually, the insulating film formed on the InSb thin film is removed in part in order to form the electrical contacts after the step (iv), so as to expose the InSb film surface at the part. Of course, if necessary, the insulating film may be fully removed. The removal of the insulating film may be done by a method being well known in the usual semiconductor technology.

According to the producing method of this invention set forth above, the InSb thin film of a thickness of at most 0.2 μm sandwiched in between the inorganic insulating material layers can be molten and recrystallized without the agglomeration and corrugation of the thin film and without the cracking of the inorganic insulating material layers. The, the crystallite size of the InSb thin film is made as large as 0.1 to 10 mm, and also the impurity concentration in the whole film is reduced by the melting and recrystallization process, so that the InSb thin film obtained is of good electronic quality having a high electron mobility. Further, the InSb thin film obtained has a flat surface as stated previously. In the InSb thin film element produced by the method of this invention, accordingly, the InSb thin film portion exhibits the extraordinarily excellent characteristics. Since the obtained films is at most 0.2 μm in thickness as described above, the thin film element is of course useful for putting into practical use, especially appropriate to the InSb MOS-FET having hitherto been unfeasible, and can naturally be used for a thin-film magnetosensitive element, an infrared radiation detector etc.

The electron mobility of the InSb film of the thin film element produced by the method of this invention can be expected to have a value equivalent to or greater than that of the Si single crystal devices.

The InSb thin film elements which are produced by the method of this invention can be listed as below.

(A) An InSb thin film element comprising a substrate at least one surface of which is made of alumina or an inorganic insulating material containing at least 12 mol % of alumina, an InSb thin film which is provided on the surface of said substrate, which has a thickness of at most 0.2 μm and which has beem molten and recrystallized, and a film which is provided on said InSb thin film and which is made of alumina or an inorganic insulating material containing at least 12 mol % of alumina.

(B) The InSb thin film element as defined in (A), wherein the thickness of said InSb thin film lies within a range of from 0.01 μm to 0.2 μm.

(C) The InSb thin film element as defined in (A), wherein the thickness of said InSb thin film lies within a range of from 0.04 μm to 0.1 μm.

(D) The InSb thin film element as defined in (A), wherein said surface of said substrate is made of alumina.

(E) The InSb thin film element as defined in (A), wherein said film provided on said InSB thin film is made of alumina.

(F) The InSb thin film element as defined in (A), wherein said surface of said substrate is made of an inorganic insulating material containing at least 12 mol % of alumina.

(G) The InSb thin film element as defined in (F), wherein said inorganic insulating material containing at least 12 mol % of alumina and forming said surface of said substrate is a member selected from the group consisting of a vitreous material of an oxide and mica.

(H) The InSb thin film element as defined in (A), wherein said film provided on said InSb thin film is made of an inorganic insulating material containing at least 12 mol % of alumina.

(I) The InSb thin film element as defined in (H), wherein said inorganic insulating material, formed on said InSb thin film, containing at least 12 mol % of alumina is a member selected from the group consisting of a vitreous material of an oxide and mica.

(J) The InSb thin film element as defined in (A), wherein a thickness of said film provided on said InSb thin film lies within a range of from 0.05 m to 1 μm.

(K) The InSb thin film element as defined in (J), wherein the thickness of said film provided on said InSb thin film lies within a range of from 0.05 μm to 0.6 μm.

(L) The InSb thin film element as defined in (A), wherein a hard glass film is further provided on said film overlying said InSb thin film.

(M) The InSb thin film element as defined in (A), wherein a hole for an electrode as has a predetermined shape and as gets to said InSb thin film is formed at a predetermined position of said film provided on said InSb thin film.

Other features and advantages of this invention will become apparent from the following description taken with reference to the accompanying drawings.

BRIEF DESCRIPTION OF THE DRAWINGS

FIG. 2 illustrates for the individual materials of insulating layers, sections of InSb thin film elements which have been obtained by several embodiments of this invention and several prior arts.

DESCRIPTION OF THE PRESENTLY PREFERRED EMBODIMENTS

Example 1

Figure 1A:
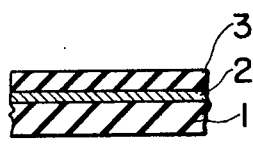
FIGS. 1a, 1b, 1c and 1d are sectional views each showing an InSb thin film element which has been obtained in an embodiment of this invention.

On a 7059 Glass substrate 1 having a thickness of 1 mm, an InSb film 2 was evaporated to a thickness of 0.15 μm by the known three-temperature evaporation method. By keeping the temperature of the glass substrate 1 at 350° C. during the evaporation, the InSb film 2 comes to have a mirror surface and is formed to be flat. Thereafter, an alumina film 3 was formed to a thickness of 0.6 μm on the InSb film 2 at 400° C. in an atmosphere of argon by the thermal decomposition of aluminum isopropoxide. The resultant substrate was zone-molten three times by the known, hot wire microzone melting method. A sectional view of the element thus fabricated is shown in FIG. 1a. The surface of the InSb film after the zone melting was flat, and the film did not rupture. The alumina film thus formed was locally removed, and the electron mobility of the InSb film at the room temperature was measured by Van der Pauw's method. Then, the electron mobility which had been 210 $cm^2$/V.sec in the evaporated state was enhanced to 830 $cm^2$/V.sec after the zone melting.

In the three-temperature evaporation method described above, the temperature of the In source was 1,000° C., the temperature of the Sb source was 540° C., and the temperature of the substrate was 400° C. At the zone melting, the heating temperature was 525° C. - 527° C., the atmosphere was a flowing He gas the moving speed of the molten zone was 6 - 7 μm/sec. The alumina film was locally removed by the well-known photoetching method by the use of a liquid etchant in which 10 parts of water were mixed to 1 part of concentrated hydrofluoric acid. The electron mobility was measured at a current density of 5,000 A/$cm^2$ and a magnetic flux density of 200 Gauss by the Pauw's method (L. J. Van der Pauw; Philips Research Reports, vol. 13, No. 1 (Feb. 1958), page 1).

Example 2

A silicon substrate 5 having a thickness of 1 mm was put in an equipment for performing the well-known CVD in which an $O_2$ gas was flowing along with an $N_2$ gas containing triisobutyl aluminum. Thus, an alumina film 4 being 0.3 μm thick was deposited on the silicon substrate 5 heated to 400° C. An InSb film 6 was deposited to a thickness of 0.08 μm on the alumina film 4 heated to 400° C. by the well-known flash evaporation method. Thereafter, using the well-known sputtering method, an alumina film 7 was formed to a thickness of 0.3 μm on the InSb film 6. The resultant substrate was put in a high temperature oven having a temperature gradient of 800° C./cm, and the InSb film was molten. Thereafter, it was cooled and solidified. At this time, when the whole substrate was once made above 525° C. and then cooled, the normal freezing took place and the solidification was conducted from one end of the substrate. This operation of the normal freezing was repeated six times. The electron mobility of the InSb film thus obtained was 530 $cm^2$/V.sec.

In the deposition of the alumina film 4 by the CVD process, the flow rates of the gases were 2 liter/min for $N_2$ which was passed through a triisobutyl aluminum liquid at 10° C.-40° C. forming the bubbles thereof, and 1 liter/min for $O_2$.

In the evaporation of the alumina film 7 by the sputtering process, the heating of a source was made by irradiation with a $CO_2$ laser.

Figure 1B:
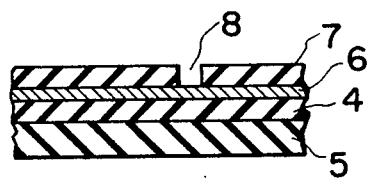

FIG. 1b is a view showing a section of the element produced in this way. The alumina film 7 is formed with a hole 8 for an electrode as meets the purpose of use.

Example 3

Figure 1C:
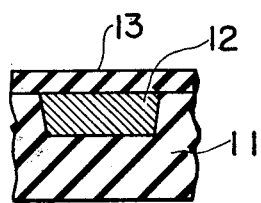
Figure 1D:
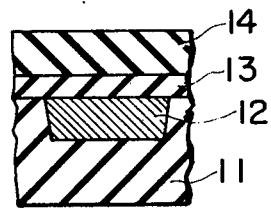

The thickness of an InSb film 12 was made 0.2 μm or 0.4 μm. As an underlying layer 11, there was selected one of layers of $SiO_2$ (0% of $Al_2O_3$), 7059 Glass (∼12% of $Al_2O_3$) and alumina (100% of $Al_2O_3$). As an overlying layer 13, there was selected one of layers of $SiO_2$, 7059 Glass, double layer of 7059 Glass and $SiO_2$, $(SiO_2)_{0.5}(Al_2O_3)_{0.5}$ and alumina. Samples were prepared by combining them. In case of the present example, in order to facilitate the observation of the situation of agglomeration of the InSb thin film 12, the substrate surface was provided with a channel of a depth corresponding to the desired thickness of the InSb thin film, the InSb film was formed on the entire surface to a thickness slightly greater than the depth, InSb at an area other than the channel part was removed by lapping so as to leave the buried layer behind, and thereafter, an insulating film as the overlying layer 13 was formed. In case of employing $(SiO_2)_{0.5}(Al_2O_3)_{0.5}$, the layer was formed by the known CVD process employing, for example, monosilane and triisobutyl aluminum. Among elements thus obtained, good ones which were quite free from the agglomeration of the InSb film have their sections illustrated in FIGS. 1c and 1d. FIG. 1c shows a case where a single overlying layer is comprised, while FIG. 1d shows a case where two overlying layers are comprised. In FIG. 1d, numeral 13 designates the insulating layer made of 7059 Glass, and numeral 14 an $SiO_2$ layer further deposited on the 7059 Glass layer.

In order that the situations of agglomeration of the InSb thin films may be apprehended in the various combinations between the overlying layer and the underlying layer, FIG. 2 shows sectional views of the various elements.

It is understood from the figure that the combinations enclosed with a thick black frame are ones which produce the InSb films of good quality and that the InSb films agglomerate or the overlying layers crack in the other combinations.

As apparent from the foregoing, it is required that the thickness of the InSb film is at most 0.2 $\mu$m and that the underlying and overlying layers which are formed under and over the InSb film are layers of alumina or an inorganic insulating material containing at least 12% of alumina.

As described above in detail, according to the producing method of this invention, the InSb film of good quality which is at most 0.2 $\mu$m thick and which is sandwiched in between the inorganic insulating material layers is allowed to be molten and recrystallized without cracking of the inorganic insulating material layers. As the melting method, the homogeneous melting method in which the whole substrate is homogeneously heated can be adopted besides the zone-melting method and the normal freezing method which have been referred to in the examples. By recrystallizing the InSb film made of many minute crystallites by such melting method, there can be easily manufactured the high performance InSb film in which the crystal grain size is rendered large, whose impurity concentrations are low owing to purification and which is flat. In the InSb thin film element obtained, the thickness of the InSb thin film is at most 0.2 $\mu$m, and the electron mobility of the InSb thin film is high. Therefore, the element has good electronic characteristics.

It is a matter of course that the thickness of the substrate, the method for depositing the insulating layer, the method for forming the InSb film and the method for melting and recrystallizing the InSb film are not restricted to those described in the examples.

What is claimed is:

1. An InSb thin film element comprising a substrate at least one surface of which is made of alumina or an inorganic insulating material containing at least 12 mol % of alumina, an InSb thin film which is provided on the surface of said substrate, which has a thickness of at most 0.2 $\mu$m and which has been molten and recrystallized, and a film which is provided on said InSb thin film and which is made of alumina or an inorganic insulating material containing at least 12 mol % of alumina.

2. The InSb thin film element according to claim 1, wherein the thickness of said InSb thin film lies within a range of from 0.01 $\mu$m to 0.2 $\mu$m.

3. The InSb thin film element according to claim 1, wherein the thickness of said InSb thin film lies within a range of from 0.04 $\mu$m to 0.1 $\mu$m.

4. The InSb thin film element according to claim 1, wherein said surface of said substrate is made of alumina.

5. The InSb thin film element according to claim 1, wherein said film provided on said InSb thin film is made of alumina.

6. The InSb thin film element according to claim 1, wherein said surface of said substrate is made of an inorganic insulating material containing at least 12 mol % of alumina.

7. The InSb thin film element according to claim 6, wherein said inorganic insulating material containing at least 12 mol % of alumina as forms said surface of said substrate is a member selected from the group consisting of a vitreous material of an oxide and mica.

8. The InSb thin film element according to claim 1, wherein said film provided on said InSb thin film is made of an inorganic insulating material containing at least 12 mol % of alumina.

9. The InSb thin film element according to claim 8, wherein said inorganic insulating material containing at least 12 mol % of alumina as provided on said InSb thin film is a member selected from the group consisting of a vitreous material of an oxide and mica.

10. The InSb thin film element according to claim 1, wherein a thickness of said film provided on said InSb thin film lies within a range of from 0.05 $\mu$m to 1 $\mu$m.

11. The InSb thin film element according to claim 10, wherein the thickness of said film provided on said InSb thin film lies within a range of from 0.05 $\mu$m to 0.6 $\mu$m.

12. The InSb thin film element according to claim 1, wherein a hard glass film is further provided on said film overlying said InSb thin film.

13. The InSb thin film element according to claim 12, wherein said hard glass film is made of $SiO_2$.

14. The InSb thin film element according to claim 1, wherein a hole for an electrode, said hole having a predetermined shape and going through said film provided on said InSb thin film to said InSb thin film, is formed at a predetermined position of said film provided on said InSb thin film.

15. The InSb thin film element according to claim 1, wherein said substrate is made wholly of alumina or an inorganic insulating material containing at least 12 mol % of alumina.

16. The InSb thin film element according to claim 1, wherein said substrate comprises a substrate material having thereon an insulating layer made of alumina or an inorganic insulating material containing at least 12 mol % of alumina, said insulating layer having a thickness of 0.05 $\mu$m to 10 $\mu$m.

17. The InSb thin film element according to claim 1, wherein the InSb thin film has a crystallite size of 0.1 to 10mm.

18. A method for producing an InSb thin film element, comprising (i) the step of preparing a substrate at least one surface of which is made of alumina or an inorganic insulating material containing at least 12 mol % of alumina, and forming on the surface of said substrate an InSb thin film whose thickness is at most 0.2 μm, (ii) the step of depositing on said InSb thin film a film which is made of alumina or an inorganic insulating material containing at least 12 mol % of alumina, (iii) the step of heating said InSb thin film to above the melting point of InSb, and (iv) the step of cooling said InSb thin film and recrystallizing InSb.

19. The method for producing an InSb thin film element according to claim 1, wherein the thickness of said InSb thin film formed in the step (i) lies within a range of from 0.01 μm to 0.2 μm.

20. The method for producing an InSb thin film element according to claim 18, wherein the thickness of said InSb thin film formed in the step (i) lies within a range of from 0.04 μm to 0.1 μm.

21. The method for producing an InSb thin film element according to claim 18, wherein said surface of said substrate in the step (i) is made of alumina.

22. The method for producing an InSb thin film element according to claim 18, wherein said film deposited on said InSb thin film in the step (ii) is made of alumina.

23. The method for producing an InSb thin film element according to claim 18, wherein said surface of said substrate in the step (i) is made of an inorganic insulating material containing at least 12 mol % of alumina.

24. The method for producing an InSb thin film element according to claim 23, wherein said inorganic insulating material containing at least 12 mol % of alumina as forms said surface of said substrate in the step (i) is a member selected from the group consisting of a vitreous material of an oxide and mica.

25. The method for producing an InSb thin film element according to claim 18, wherein said film deposited on said InSb thin film in the step (ii) is made of an inorganic insulating material containing at least 12 mol % of alumina.

26. The method for producing an InSb thin film element according to claim 25, wherein said inorganic insulating material containing at least 12 mol % of alumina as deposited on said InSb thin film in the step (ii) is a member selected from the group consisting of a vitreous material of an oxide and mica.

27. The method for producing an InSb thin film element according to claim 18, wherein a thickness of said film deposited on said InSb thin film in the step (ii) lies within a range of from 0.05 μm to 1 μm.

28. The method for producing an InSb thin film element according to claim 27, wherein the thickness of said film deposited on said InSb thin film in the step (ii) lies within a range of from 0.05 μm to 0.6 μm.

29. The method for producing an InSb thin film element according to claim 18, wherein after depositing said film on said InSb thin film in the step (ii), a hard glass film is further deposited thereon.

30. The method of producing an InSb thin film element according to claim 29, wherein said hard glass film is made of $SiO_2$.

31. The method for producing an InSb thin film element according to claim 18, wherein a heating temperature in the step (iii) is 525° C. to 1,000° C.

32. The method for producing an InSb thin film element according to claim 18, wherein the step (iii) said InSb thin film is heated by the zone-melting method.

33. The method for producing an InSb thin film element according to claim 18, wherein after the step (iv), at least a part of said film formed by the step (ii) is removed.

34. The method of producing an InSb thin film element according to claim 18, wherein said preparing a substrate at least one surface of which is made of alumina or an inorganic insulating material containing at least 12 mol % of alumina comprises applying an insulating layer of alumina or an inorganic insulating material containing at least 12 mol % of alumina on a substrate material, said insulating layer having a thickness of 0.05 μm to 10 μm.

35. The method for producing an InSb thin film element according to claim 18, wherein the cooling of the InSb thin film takes place at a maximum cooling rate of 30,000° C./hr.

36. The method for producing an InSb thin film element according to claim 18, whereby an InSb thin film having a crystallite size of 0.1 to 10mm is achieved.

* * * * *